(12) United States Patent
Steegmüller et al.

(10) Patent No.: US 8,396,092 B2
(45) Date of Patent: Mar. 12, 2013

(54) VERTICALLY EMITTING, OPTICALLY PUMPED SEMICONDUCTOR COMPRISING AN EXTERNAL RESONATOR AND FREQUENCY DOUBLING ON A SEPARATE SUBSTRATE

(75) Inventors: Ulrich Steegmüller, Northville, MI (US); Frank Singer, Regenstauf (DE); Thomas Schwarz, Regensburg (DE); Michael Kühnelt, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 252 days.

(21) Appl. No.: 12/087,331

(22) PCT Filed: Dec. 29, 2006

(86) PCT No.: PCT/DE2006/002332
§ 371 (c)(1), (2), (4) Date: Nov. 18, 2008

(87) PCT Pub. No.: WO2007/076841
PCT Pub. Date: Jul. 12, 2007

(65) Prior Publication Data
US 2009/0213881 A1   Aug. 27, 2009

(30) Foreign Application Priority Data
Dec. 30, 2005 (DE) .......................... 10 2005 063 104
Apr. 12, 2006 (DE) .......................... 10 2006 017 294

(51) Int. Cl.
*H01S 3/091* (2006.01)
(52) U.S. Cl. .............. 372/75; 372/70; 372/99; 372/100; 372/105; 372/50.124; 372/22; 372/21
(58) Field of Classification Search .................... 372/75, 372/70, 99, 100, 105, 50.124, 22, 21
See application file for complete search history.

(56) References Cited

U.S. PATENT DOCUMENTS

| | | |
|---|---|---|
| 5,436,920 A | 7/1995 | Minemoto et al. |
| 5,553,088 A * | 9/1996 | Brauch et al. .................... 372/34 |
| 5,637,885 A | 6/1997 | Heinemann et al. |

(Continued)

FOREIGN PATENT DOCUMENTS

| | | |
|---|---|---|
| DE | 43 44 227 | 1/1995 |
| DE | 199 29 878 | 1/2001 |

(Continued)

OTHER PUBLICATIONS

Michel Fialin "Anomalies in the electron probe microanalysis of $Y_3Al_5O_{12}$ garnets (YAG): An illustration of the role of beam-induced field in insulator investigations", (Abstract), Apr. 11, 2005.

*Primary Examiner* — Kinam Park
(74) *Attorney, Agent, or Firm* — Cozen O'Connor

(57) ABSTRACT

An optically pumped semiconductor apparatus having a surface-emitting semiconductor body (1) which has a radiation passage area (1a) which faces away from a mounting plane of the semiconductor body (1), and an optical element (7) which is suitable for directing pump radiation (17) onto the radiation passage area (1a) of the semiconductor body (1).

19 Claims, 13 Drawing Sheets

U.S. PATENT DOCUMENTS

| | | | |
|---|---|---|---|
| 6,130,901 | A | 10/2000 | Takamine et al. |
| 6,370,180 | B2 | 4/2002 | Zenteno |
| 6,594,297 | B1 | 7/2003 | Hayakawa |
| 6,680,956 | B2 * | 1/2004 | Gerstenberger et al. ........ 372/20 |
| 6,954,479 | B2 | 10/2005 | Albrecht et al. |
| 7,408,972 | B2 | 8/2008 | Schmid et al. |
| 7,551,660 | B2 | 6/2009 | Lutgen |
| 2002/0001328 | A1 * | 1/2002 | Albrecht et al. ................ 372/50 |
| 2002/0110159 | A1 * | 8/2002 | Gerstenberger et al. ........ 372/22 |
| 2004/0207907 | A1 | 10/2004 | Bayart et al. |
| 2005/0008056 | A1 | 1/2005 | Albrecht et al. |
| 2005/0265418 | A1 * | 12/2005 | Nikonov ......................... 372/64 |
| 2005/0276301 | A1 | 12/2005 | Spinelli et al. |
| 2006/0274807 | A1 * | 12/2006 | Cho et al. ........................ 372/70 |

FOREIGN PATENT DOCUMENTS

| | | |
|---|---|---|
| DE | 10 2004 012 014 | 10/2005 |
| DE | 10 2004 050 118 | 3/2006 |
| EP | 1 303 796 | 1/2002 |
| GB | 2 353 405 | 2/2001 |
| JP | 2001-148536 | 5/2001 |
| TW | 444424 | 7/2001 |
| TW | 520578 | 2/2003 |
| TW | 531950 | 5/2003 |
| TW | 595059 | 6/2004 |
| TW | I244815 | 12/2005 |
| WO | WO 02/05038 | 1/2002 |
| WO | WO 2006/012819 | 2/2006 |
| WO | WO 2006/032252 | 3/2006 |

* cited by examiner

US 8,396,092 B2

VERTICALLY EMITTING, OPTICALLY PUMPED SEMICONDUCTOR COMPRISING AN EXTERNAL RESONATOR AND FREQUENCY DOUBLING ON A SEPARATE SUBSTRATE

RELATED APPLICATIONS

This is a U.S. national stage under 35 USC 371 of application No. PCT/DE2006/002332, filed on 29 Dec. 2006.

This application claims the priority of German applications no. 10 2005 063 104.5 filed Dec. 30, 2005 and no. 10 2006 017 294.9 filed Apr. 12, 2006, the entire content of both of which is hereby incorporated by reference.

FIELD OF THE INVENTION

The invention specifies an optically pumped semiconductor apparatus. It also specifies an optical projection apparatus having such a semiconductor apparatus.

SUMMARY OF THE INVENTION

One object to be achieved involves providing a particularly compact semiconductor apparatus.

This and other objects are attained in accordance with one aspect of the present invention directed to an optically pumped semiconductor apparatus comprising a surface-emitting semiconductor body which has a radiation passage area which faces away from a mounting plane for the semiconductor body, and an optical element which is suitable for directing pump radiation onto the radiation passage area of the semiconductor body.

In line with at least one embodiment of the semiconductor apparatus, the semiconductor apparatus has a surface-emitting semiconductor body. The semiconductor body has a radiation passage area through which electromagnetic radiation can be input into the semiconductor body and output from the semiconductor body. In particular, the semiconductor body can be optically pumped by the radiation passage area. This means that pump radiation which is input into the semiconductor body by the radiation passage area promotes the semiconductor body to produce electromagnetic radiation, which then in turn leaves the semiconductor body through the radiation passage area. In this context, the semiconductor body is suitable for producing laser radiation using an externally arranged resonator mirror, that is to say one which is arranged at a distance from the semiconductor body.

In line with at least one embodiment of the optically pumped semiconductor apparatus, the radiation passage area faces away from a mounting plane of the semiconductor body. By way of example, mounting plane is understood to mean the main extension plane of a first carrier on which the semiconductor body is arranged. The same carrier may than have further elements of the semiconductor apparatus fitted on it. The radiation passage area runs preferably parallel or essentially parallel to the mounting plane of the semiconductor body. In this context, "essentially parallel" means that the radiation passage area may also be at a small angle to the mounting plane of the semiconductor body on account of mounting tolerances, for example. The radiation emitted by the semiconductor body during operation and emerging through the radiation passage area runs at right angles or essentially at right angles to the mounting plane of the semiconductor body and is directed away from the mounting plane. By way of example, the semiconductor laser apparatus comprises precisely one pump radiation source in this case.

In line with at least one embodiment of the optically pumped semiconductor apparatus, the semiconductor apparatus has, in addition to the semiconductor body, an optical element which is suitable for directing pump radiation onto the radiation passage area of the semiconductor body. This means that pump radiation is not directed from a pump radiation source directly onto the radiation passage area of the semiconductor body, but rather the pump radiation passes through or hits at least one optical element which directs the pump radiation onto the radiation passage area of the semiconductor body.

In line with at least one embodiment of the optically pumped semiconductor apparatus, the semiconductor apparatus has a surface-emitting semiconductor body which comprises a radiation passage area which faces away from a mounting plane of the semiconductor body. In addition, the semiconductor apparatus has an optical element which is suitable for directing pump radiation onto the radiation passage area of the semiconductor body.

In line with at least one embodiment of the optically pumped semiconductor apparatus, the semiconductor apparatus comprises a pump radiation source. Preferably, the pump radiation source provided is a semiconductor laser component such as an edge-emitting semiconductor laser or an edge-emitting semiconductor laser bar. In this case, the pump radiation source may comprise not only a semiconductor body which is suitable for producing radiation but also a thermally conductive element on which the semiconductor body is disposed. The compound structure comprising the thermally conductive element and the radiation-emitting semiconductor body then forms the pump radiation source of the semiconductor apparatus.

In line with at least one embodiment of the optically pumped semiconductor apparatus, the pump radiation source is fitted in a plane parallel to the mounting plane or in the mounting plane of the semiconductor body. To this end, the pump radiation source and the surface-emitting semiconductor body can be disposed and fitted on a common first carrier, for example. It is also possible for the pump radiation source and the surface-emitting semiconductor body to be disposed on a respective dedicated carrier and for the two carriers to be mechanically connected to one another.

In line with at least one embodiment of the optically pumped semiconductor apparatus, the surface-emitting semiconductor body, the optical element for directing the pump radiation onto the radiation passage area of the semiconductor body and the pump radiation source are disposed on a common first carrier. By way of example, these elements of the semiconductor apparatus may be disposed on the common carrier in a common mounting plane or in mounting planes which run parallel to one another.

In line with at least one embodiment of the optically pumped semiconductor apparatus, the first carrier is formed by a connection carrier. Preferably, the pump radiation source is electrically connected to the connection carrier. By way of example, the connection carrier is a printed circuit board. The connection carrier may comprise a basic body made of an electrically insulating, highly thermally conductive material. By way of example, the top of the connection carrier—the side on which the semiconductor body is also disposed—may have electrical conductor tracks disposed on or against it. The conductor tracks can be used for electrical contact with the pump radiation source of the semiconductor apparatus, for example.

In line with at least one embodiment of the semiconductor apparatus, the optical element is suitable for directing the pump radiation onto the radiation passage area of the semiconductor body through optical refraction. That is to say that when passing through the radiation passage areas of the optical element the pump radiation is deflected on account of the difference between the refractive indexes of the optical element and the surrounding material—for example air—such that the pump radiation is directed onto the radiation passage area of the semiconductor body when it has passed through the optical element.

In line with at least one embodiment of the semiconductor apparatus, the optical element is suitable for directing the pump radiation onto the radiation passage area of the semiconductor body through a reflection. That is to say that the optical element is a reflective optical element. Preferably, the optical element is suitable for directing the pump radiation onto the radiation passage area of the semiconductor body through a single reflection. That is to say that the optical element is preferably not an optical fiber in which pump radiation is deflected by a plurality of reflections. By way of example, the optical element is a highly reflective mirror. By way of example, the mirror is a planar mirror. That is to say that the mirror is not a concave mirror, for example.

During operation of the semiconductor apparatus, pump radiation runs, at least in sections, for example, initially parallel or essentially parallel to the radiation passage area of the semiconductor body. By way of example, the pump radiation can run over the radiation passage area of the semiconductor body. That is to say that the pump radiation first of all runs over the semiconductor body without hitting the semiconductor body. The reflective optical element is then arranged downstream of the semiconductor body in the direction of the pump radiation. The pump radiation—having crossed the semiconductor body and hence the radiation passage area of the semiconductor body—hits the reflective optical element. The reflective optical element directs the pump radiation onto the radiation passage area of the semiconductor body through a—preferably precisely one—reflection. In this case, the deflected pump radiation can—at least for a short distance—run in the opposite direction from the direction of the pump radiation, the direction which the pump radiation had before it hit the reflective optical element.

In line with at least one embodiment of the semiconductor apparatus, the optical element is suitable for directing the pump radiation in the direction of the mounting plane of the semiconductor body. That is to say that the pump radiation first of all runs parallel to the mounting plane, or is directed away from the mounting plane, for a particular distance before it hits the optical element. In any case, the pump radiation runs at a particular height above the mounting plane and preferably also above the radiation passage area of the semiconductor body for this distance. The optical element is suitable for directing the pump radiation downwards—in the direction of the mounting plane and hence in the direction of the radiation passage area of the semiconductor body.

In line with at least one embodiment of the semiconductor apparatus, the semiconductor body is arranged in the mounting plane of the semiconductor body between the pump radiation source and the optical element. That is to say the pump radiation runs over the semiconductor body before it is directed onto the radiation passage area of the semiconductor body. By way of example, it is possible for the pump radiation source, the semiconductor body and the optical element to be arranged in this order along a straight line.

In line with at least one embodiment of the semiconductor apparatus, the semiconductor apparatus comprises a resonator top element which is arranged downstream of the mounting plane of the semiconductor body in a main radiation direction of the semiconductor body. In this case, the resonator top element is also arranged downstream of the radiation passage area of the semiconductor body in a main radiation direction of the semiconductor body.

By way of example, the resonator top element comprises a second carrier, on which a resonator mirror is fitted. The resonator top element is preferably arranged parallel or essentially parallel to the mounting plane of the semiconductor body above the mounting plane of the semiconductor body.

The resonator top element also preferably comprises a deflection element. By way of example, the deflection element may be a deflection mirror. Electromagnetic radiation emitted by the semiconductor body during operation first of all hits the deflection element and from there hits the resonator mirror. The resonator mirror in turn reflects the laser radiation onto the deflection element, which directs the radiation through the radiation passage area into the semiconductor body. By way of example, the semiconductor body comprises a reflective layer sequence, for example a Bragg mirror, which forms a further resonator mirror for the laser resonator formed in this way.

In line with at least one embodiment, the resonator top element is spaced apart from the mounting plane of the semiconductor body by means of a spacing element. The spacing element is fitted on the first carrier, for example. The spacing element has the resonator top element fitted on it. Preferably, the semiconductor apparatus comprises at least two spacing elements.

In line with at least one embodiment, the spacing element comprises an optical element or the spacing element is formed from an optical element. By way of example, the spacing element may in this case comprise the optical element or consist of the optical element, which is suitable for directing pump radiation onto the radiation passage area of the semiconductor body.

In addition, however, it is also possible for spacing elements of the semiconductor apparatus to perform other optical functions. By way of example, one of the spacing elements may be suitable for altering the direction of the pump radiation, so that the pump radiation is directed away from the mounting plane of the semiconductor body after passing through the spacing element.

In line with at least one embodiment of the semiconductor apparatus, the resonator top element comprises a frequency-converting element. The frequency-converting element is preferably an optically nonlinear crystal. Preferably, the frequency-converting element is disposed on the carrier. The frequency-converting element is preferably suitable for frequency multiplication, for example for frequency doubling of part of the electromagnetic radiation passing through the frequency-converting element.

In line with at least one embodiment, the resonator top element comprises a heating element. The heating element is preferably suitable for heating the frequency-converting element to a prescribable temperature. To this end, by way of example, the heating element is thermally conductively connected to the frequency-converting element. In this arrangement, the heating element and the frequency-converting element may be in direct contact with one another. Alternatively, it is possible for heat from the heating element to be routed via a thermally conductive element—for example the second carrier—to the frequency-converting element.

In line with at least one embodiment of the semiconductor apparatus, the heating element is formed by a metal coating. Preferably, the second carrier comprises at least one metal coating which can be used to raise and/or ascertain the temperature of the resonator top element. Preferably, the temperature of the resonator top element can be raised and ascertained by means of the metal coating. The metal coating is preferably a patterned metal coating. By way of example, the metal coating is in meandrous form or the metal coating has a plurality of recesses. The metal coating preferably contains or is made of at least one of the following metals: platinum, gold.

Preferably, the metal coating also has contact points which can be used for making electrical contact with the metal coating. By passing current through the metal coating, it is possible to raise the temperature of the resonator top element in a specific manner. This allows the frequency conversion element to be heated to a prescribable operating temperature, for example. In addition, it is possible—for example by measuring the temperature-dependent electrical resistance of the metal coating—to ascertain the temperature of the metal coating and hence the temperature of the resonator top element and of the frequency conversion element.

To this end, the metal coating is preferably connected to a control apparatus which is suitable for setting and regulating an externally prescribable temperature for the metal coating. By way of example, the control apparatus may comprise a microcontroller. The control apparatus may be arranged on the connection carrier—the first carrier—of the semiconductor apparatus. Alternatively, it is possible for the control apparatus to be arranged outside of the semiconductor apparatus and to be electrically conductively connected to the semiconductor apparatus.

In line with at least one embodiment of the semiconductor apparatus, the resonator top element is electrically conductively connected to the connection carrier. By way of example, the resonator top element may be connected to the connection carrier by means of connecting wires—for example bonding wires. The connecting wires are suitable for electrically conductively connecting the contact points of the heating element to the connection carrier.

In line with at least one embodiment of the semiconductor apparatus, the temperature—for example the average temperature—of the resonator top element is at least 10 K more than the temperature—for example the average temperature—of the connection carrier during operation of the semiconductor apparatus. By way of example, the average temperature of the connection carrier is regulated to no more than 35° C., preferably no more than 30° C.—for example using an active or passive cooling element. The average temperature of the resonator top element is preferably kept at least 45° C., preferably at least 50° C., by means of the heating element. In this case, the resonator top element and the connection carrier are largely thermally insulated from one another. This can be achieved using spacing elements which are poor conductors of heat, for example, which may contain a glass, for example.

Another aspect of the invention is directed to an optical projection apparatus having an optically pumped semiconductor apparatus, as described in connection with at least one of the embodiments of the semiconductor apparatus which are presented above. In line with at least one embodiment, the optical projection apparatus comprises a control apparatus, for example, which is suitable for control the optically pumped semiconductor apparatus.

In addition, the optical projection apparatus may comprise an imaging element and projection optics, for example.

BRIEF DESCRIPTION OF THE DRAWINGS

The semiconductor apparatus described here is explained in more detail below using exemplary embodiments and with reference to the associated figures.

DETAILED DESCRIPTION OF THE DRAWINGS

In the exemplary embodiments and figures, components which are the same or have the same action are in each case provided with the same reference symbols. The elements shown should be considered to be true to scale, but rather individual elements may be shown exaggeratedly large as an aid to understanding.

Figure 1A:
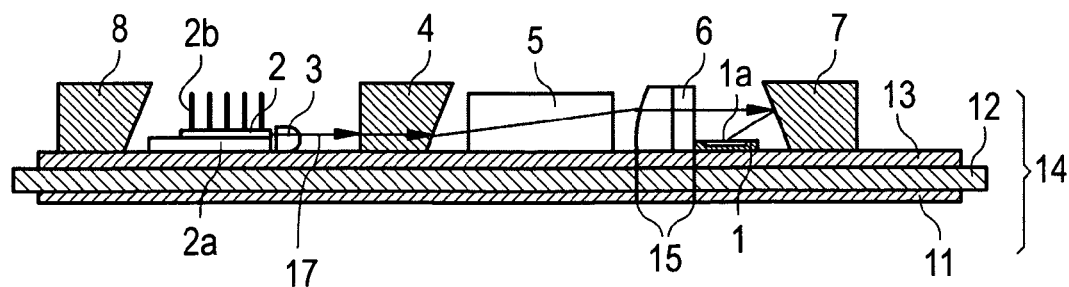
FIG. 1A shows a schematic sectional view of the pump unit in a semiconductor apparatus as described here based on a first exemplary embodiment of the semiconductor apparatus.

FIG. 1A shows a schematic sectional view of the pump unit in a semiconductor apparatus as described here based on a first exemplary embodiment of the semiconductor apparatus.

The pump unit comprises a connection carrier 14. The base area of the surface-emitting semiconductor laser apparatuses described here—that is to say the base area of the connection carrier 14—is preferably between 30 and 150 mm². In the exemplary embodiment shown here, the connection carrier 14 comprises a basic body 12, a bottom metallization 11 and a patterned top metallization 13. The connection carrier 14 is preferably a direct bonded copper (DBC) composite. By way of example, the basic body 12 consists of a ceramic material such as an AlN. The thickness of the basic body 12 is preferably between 0.2 and 0.5 mm, particularly preferably 0.38 mm. The top metallization 13 and the bottom metallization 11 consist of copper, for example, and have a thickness of between 0.1 and 0.3 mm, preferably 0.2 mm. Advantageously, copper has good thermal conductivity of approximately 400 watts per meter Kelvin. The compound structure with the AlN basic body 12 lowers the effective coefficient of thermal expansion of the connection carrier 14 on its surface. This benefits the mounting of semiconductor bodies with a low expansion coefficient.

The patterned top metallization 13 forms conductor tracks which can be used to make electrical contact with active semiconductor components fitted on the connection carrier 14.

As an alternative to the connection carrier 14 described in connection with FIG. 1A, it is also possible to use a connection carrier 14 which comprises a ceramic basic body 12, for example consisting of AlN. The top of the basic body 12 may then have a top metallization 13 disposed on it. To this end, a gold metallization, for example, is patterned directly onto the basic body 12—for example by means of sputtering or vapor deposition—using a mask. In this case, the thickness of the gold layer is no more than 1 μm, preferably no more than 500 nm. A connection carrier of this kind is distinguished from a DBC connection carrier by a particularly smooth surface. In this context, the thickness of the basic body 12 is preferably no more than 1 mm, particularly preferably no more than 0.7 mm. Metal blockers—for example for a solder material—which may consist of platinum or NiCr, for example, or contain at least one of these materials can be deposited and patterned directly onto the connection carrier 14 by means of vapor deposition or sputtering.

The connection carrier 14 has a surface-emitting semiconductor body 1 disposed on it. By way of example, the surface-emitting semiconductor body 1 is soldered or bonded on the connection carrier 14. Preferably, the surface-emitting semiconductor body 1 is mounted on the connection carrier 14 by means of a solder connection. This is particularly suited to a thin layer solder. That is to say that the surface-emitting semiconductor body 1 is mounted using a solder which is deposited by means of sputtering or vapor deposition. The solder preferably contains or consists of at least one of the following materials: AuSn, Sn, SnAg, In, InSn. Preferably, the thickness of the solder layer is between 1 and 5 μm.

The surface-emitting semiconductor body 1 comprises a reflective layer sequence and a radiation-producing layer sequence. The reflective layer sequence is preferably a reflective metal layer, a Bragg mirror or a combination of these reflective layers. Preferably, the reflective layer sequence is a Bragg mirror which has a plurality of semiconductor layer pairs with an advantageously high refractive index difference. Preferably, the Bragg mirror comprises a sequence of 20 to 30 or more semiconductor layer pairs, which results in particularly high reflectivity for the mirror of 99.9% or higher. The Bragg mirror is advantageously fabricated epitaxially together with the other semiconductor layers of the semiconductor body 1. The Bragg mirror is preferably arranged on that side of the semiconductor body 1 which faces the connection carrier 14.

The radiation-producing layer sequence of the semiconductor body comprises an active region with a pn junction and/or a single quantum well structure and/or preferably a multiple quantum well structure—particularly preferably an undoped multiple quantum well structure—which is suitable for producing radiation. Within the context of the description, the term quantum well structure particularly also covers that structure which prompts charge carriers to undergo quantization of their energy states through confinement. In particular, the term quantum well structure does not contain any indication of the dimensionality of the quantization. It therefore covers, inter alia, quantum wells, quantum wires and quantum dots and any combination of these structures.

Preferably, the radiation-emitting layer sequence is based on an III-V compound semiconductor material. That is to say that the radiation-emitting layer sequence comprises at least one layer which consists of an III-V compound semiconductor material. Preferably, the radiation-emitting layer sequence is based on a nitride, phosphide or particularly preferably arsenide compound semiconductor.

In the present context, "based on nitride compound semiconductors" means that the radiation-emitting layer sequence or at least one layer from it comprises a nitride V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition based on the above formula. Rather, it may have one or more dopants and also additional components which do not significantly change the characteristic physical properties of the $Al_nGa_mIn_{1-n-m}N$ material. For the sake of simplicity, however, the above formula contains only the major components of the crystal lattice (Al, Ga, In, N), even if some of these can be replaced by small amounts of other substances.

In this context, "based on phosphide compound semiconductors" means that the radiation-emitting layer sequence or at least one layer from it preferably comprises $Al_nGa_mIn_{1-n-m}P$, where $0 \leq n \leq 1$, $0 \leq m \leq 1$ and $n+m \leq 1$. In this case, this material need not necessarily have a mathematically exact composition based on the above formula. Rather, it may have one or more dopants and also additional components which do not significantly change the physical properties of the material. For the sake of simplicity, however, the above formula contains only the major components of the crystal lattice (Al, Ga, In, P), even if some of these can be replaced by small amounts of other substances.

In this context, "based on arsenide compound semiconductors" means that the radiation-emitting layer sequence or at least one layer from it preferably comprises $Al_nGa_mIn_{1-n-m}As$, where $0 \leq n \leq 1$, $0 \leq m \leq 1$ and $n+m \leq 1$. In this case, this material need not necessarily have a mathematically exact composition based on the above formula. Rather, it may have one or more dopants and also additional components which do not significantly change the physical properties of the material. For the sake of simplicity, however, the above formula contains only the major components of the crystal lattice (Al, Ga, In, As), even if some of these can be replaced by small quantities of other substances.

These materials are distinguished by high internal quantum efficiencies which can be achieved in a simplified manner, and are suitable for radiation from the ultraviolet spectral range, in particular nitride-based compound semiconductor material, through the visible spectral range, in particular phosphide-based compound semiconductor materials, to the infrared spectral range, in particular arsenide-based compound semiconductor materials.

The radiation-producing layer sequence in the semiconductor body is preferably based on an arsenide compound semiconductor material. Radiation in the infrared spectral range, particularly in the wavelength range between 800 nm and 1100 nm, can be produced particularly efficiently in this material system. By way of example, the carrier contains gallium arsenide and the radiation-emitting layer sequence or at least one layer from it is based on the material system $Al_nGa_mIn_{1-n-m}As$, where $0 \leq n \leq 1$, $0 \leq m \leq 1$ and $n+m \leq 1$.

In addition, the connection carrier 14 has a pump radiation source 2 arranged on it. By way of example, the pump radiation source 2 comprises an edge-emitting semiconductor laser and also a thermal element 2a. The thermally conductive element 2a preferably consists of a material with good thermal conductivity, such as diamond, aluminum nitride or silicone carbide, or contains at least one of these materials. The pump radiation source 2 is electrically conductively connected to the connection carrier 14 by means of connecting wires 2b. Preferably, the pump radiation source 2 is mounted on the connection carrier 14 by means of a solder connection. This is particularly suited to a thin-layer solder. That is to say that the pump radiation source 2 is mounted by means of a solder which is deposited by sputtering or vapor deposition. The solder preferably contains or consists of at least one of the following materials: AuSn, Sn, SnAg, In, InSn. Preferably, the thickness of the solder layer is between one and five microns.

The pump radiation source 2 has a lens 3 downstream of it. By way of example, the lens 3 is used for fast axis collimation (FAC) of the pump radiation 17 emitted by the pump radiation source 2. To this end, the lens 3 has an aspherically curved radiation outlet area and may consist of a highly refractive material such as GaP, for example.

The lens 3 has a further optical element 4 arranged downstream of it in the main radiation direction of the pump radiation source 2. The optical element 4 is preferably suitable for refracting the passing pump radiation. By way of example, the optical element 4 is suitable for refracting or directing the pump radiation 17 away from the connection carrier 14. The optical element 4 preferably contains a glass.

The optical element 4 has a cylinder lens 5 and a spherical lens 6 arranged downstream of it. The lenses 5, 6 are used for slow axis collimation (SAC) and/or fast axis collimation of the passing pump radiation. By way of example, the two lenses 5, 6 may also be replaced by a single cylinder lens with an aspherically curved radiation passage area. From the lenses 5, 6, the pump radiation is routed to the deflection element 7.

By way of example, the deflection element 7 contains a glass, with the area which faces the surface-emitting semiconductor body having a highly reflective coating for the pump radiation. The deflection element 7 directs the impinging pump radiation onto the radiation passage area 1a of the surface-emitting semiconductor body 1 such that pump radiation 17 hits the radiation passage area 1a preferably at an acute angle.

In addition, a spacing element 8 may be arranged on the carrier 14. The elements 8, 4, 7 may be elements which are shaped in the same manner and consist of the same material. They are then distinguished merely by surfaces in reflective, antireflection-coated or uncoated form and their orientation on the connection carrier 14. Elements 8, 4, 7, retain resonator top element 40 (see below) spaced from semiconductor body 1. Spacing element 8 has no optical purpose.

Figure 1B:
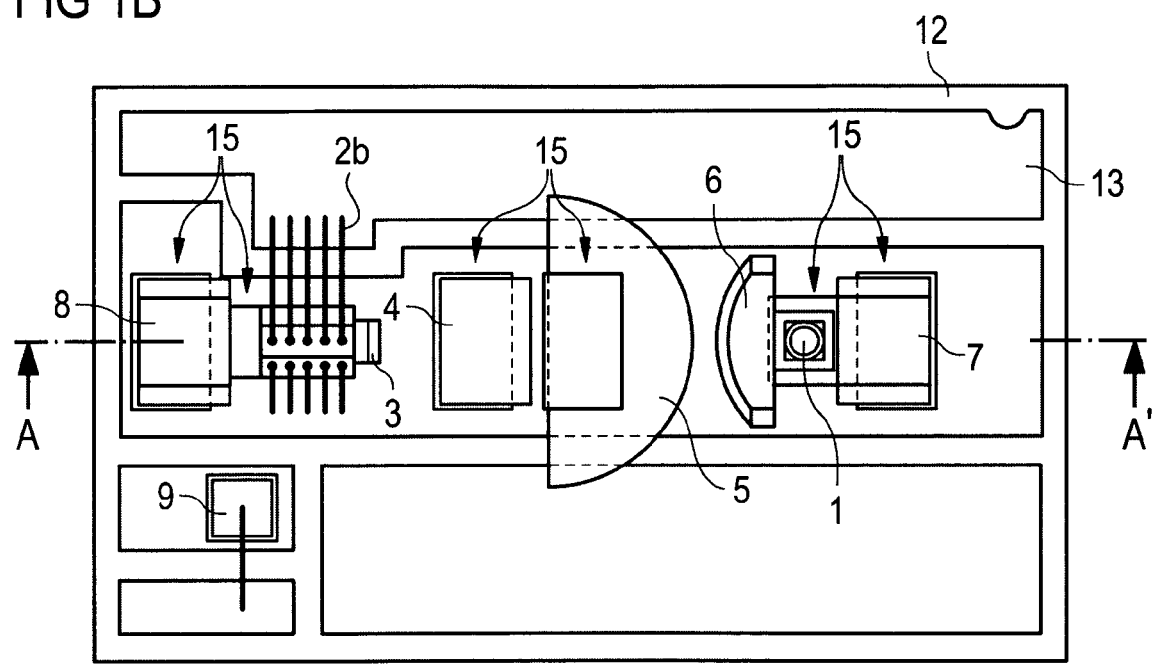
FIG. 1B shows a schematic plan view of the pump unit in the optically pumped semiconductor apparatus based on the first exemplary embodiment.

FIG. 1B shows a schematic plan view of the pump unit in the optically pumped semiconductor apparatus based on the first exemplary embodiment.

As can be seen from FIG. 1B, the connection carrier 14 also holds a temperature sensor 9 which comprises an NTC resistor, for example. The temperature sensor 9 can be used to ascertain the average temperature of the connection carrier 14. Depending on the average temperature of the connection carrier 14, it is possible to use a thermoelectric cooler, for example, which may be arranged on the bottom of the connection carrier 14, for example, to set an operating temperature for the pump unit. Preferably, the operating temperature of the pump unit is between 20 and 35° C., particularly preferably 25° C.

Figure 1C:
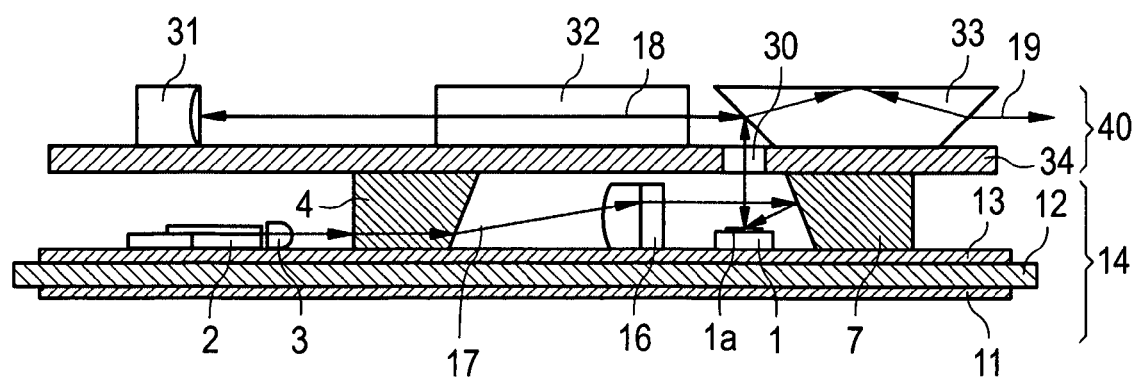
FIG. 1C shows a schematic sectional view of an optically pumped semiconductor apparatus based on a second exemplary embodiment.

FIG. 1C shows a schematic sectional view of an optically pumped semiconductor apparatus based on a second exemplary embodiment.

In this case, the pump unit has a resonator top element 40 arranged downstream of the surface-emitting semiconductor body 1 in the main radiation direction.

The pump unit comprises a connection carrier 14, as described above. The pump unit also comprises a pump radiation source 2 which has an FAC lens 3 arranged downstream of it. The pump radiation is routed from the FAC lens 3 through an optical element 4 which refracts the pump radiation 17 away from the connection carrier 14. Next, the pump radiation is routed through an aspherical lens 16 which is provided for the purpose of collimating the pump radiation. From there, the pump radiation hits the deflection element 7 which directs the pump radiation onto the radiation passage area 1a of the surface-emitting semiconductor body 1. The pump radiation 17 prompts production of laser radiation 18 at the fundamental frequency in the semiconductor body 1. The laser radiation 18 at the fundamental frequency passes through a recess 30, situated in the carrier 34 of the resonator top element 40, into the resonator top element 40. A deflection element 33 which is formed by a dove prism, for example, directs the laser radiation in the direction of a resonator mirror 31. The laser resonator preferably contains an optically nonlinear crystal 31 which is used for frequency multiplication of the passing laser radiation, for example. A large portion of the converted radiation 19 produced in this way is output from the semiconductor apparatus by the deflection element 33.

Preferably, the optically nonlinear crystal 31 comprises at least one of the following crystals: lithiumtriborate, for example $LiB_3O_5$ (LBO), bismuthtriborate, for example $BiB_3O_6$ (BiBO), potassium titanylphosphate $KTiOPO_4$ (KTP), magnesium-oxide-doped congruent lithium niobate, for example $MgO:LiNbO_3$ (MgO:LN), magnesium-oxide-doped stoichiometric lithium niobate, for example MgO:s-$LiNbO_3$ (MgO:SLN), magnesium-oxide-doped stoichiometric lithium tantalite, for example $MgO:LiTaO_3$ (MgO:SLT), stoichiometric $LiNbO_3$ (SLN), stoichiometric $LiTaO_3$ (SLT), RTP ($RbTiOPO_4$), KTA ($KTiOAsO_4$), RTA ($RbTiOAsO_4$), CTA ($CsTiOAsO_4$).

Preferably, the optically nonlinear crystal is suitable for doubling the frequency of the radiation passing through it.

In addition, the laser resonator may contain a frequency-selective element such as an etalon or a birefringent filter, which advantageously simplifies spectrally stable and narrowband operation of the laser.

Figure 1D:
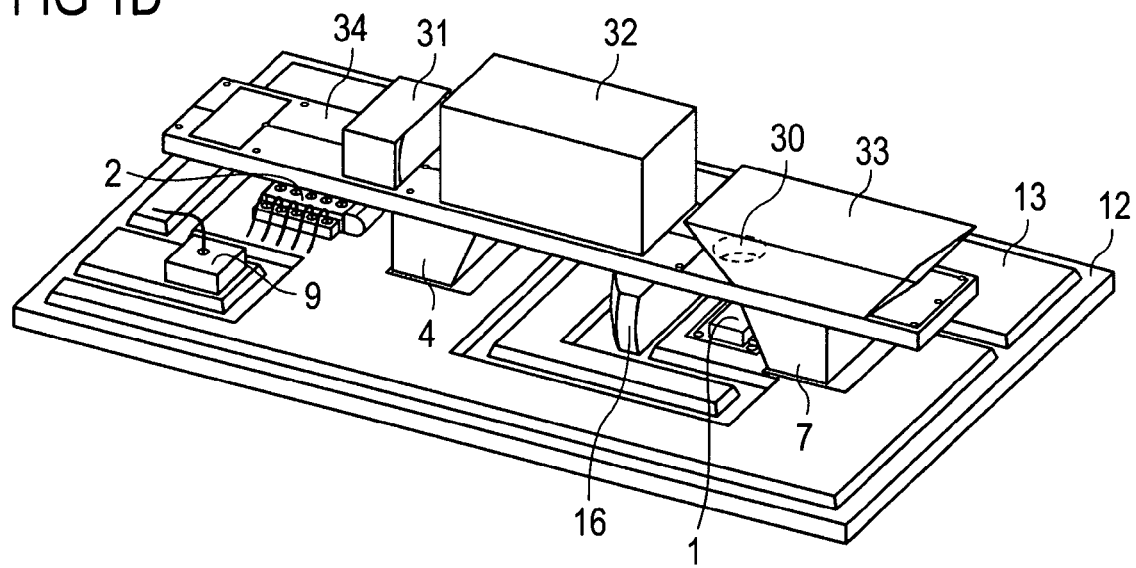
FIG. 1D shows a schematic perspective view of the optically pumped semiconductor apparatus based on the second exemplary embodiment.

FIG. 1D shows a schematic perspective view of the optically pumped semiconductor apparatus based on the second exemplary embodiment.

Figure 1E:
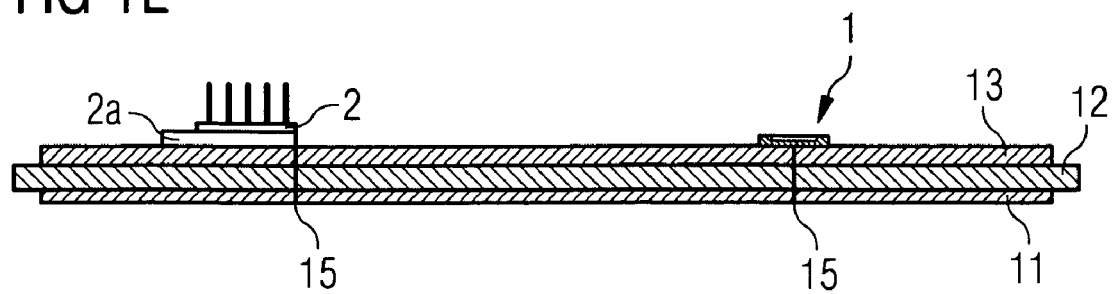
FIG. 1E shows a schematic sectional view of the pump unit in an optically pumped semiconductor apparatus based on the first or the second exemplary embodiment before the passive optical elements are disposed.
Figure 1F:
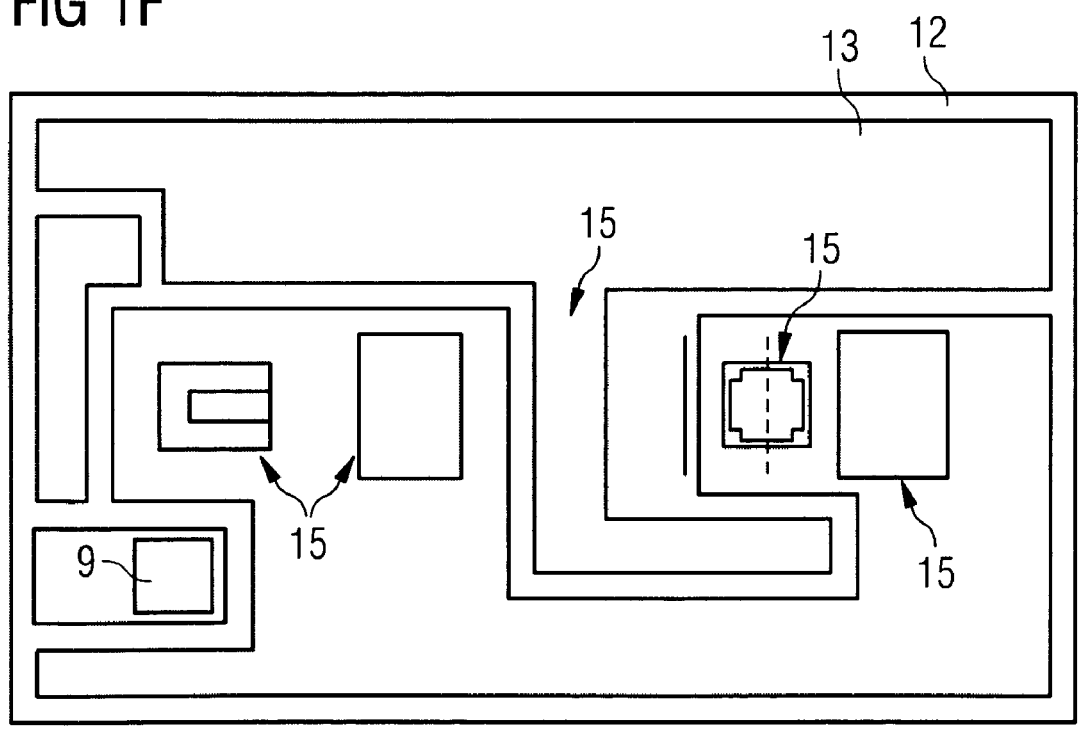
FIG. 1F shows a schematic plan view of the pump unit in an optically pumped semiconductor apparatus based on the first or the second exemplary embodiment.

FIG. 1E shows a schematic sectional view of the pump unit in an optically pumped semiconductor apparatus based on the first or the second exemplary embodiment before passive optical elements are disposed. FIG. 1F shows the associated schematic plan view.

As can be seen from FIGS. 1E and 1F, the connection carrier 14 has secondary alignment markers 15. By way of example, the secondary alignment markers 15 are deposit structures which are in the form of photographically patterned thin layers.

The secondary alignment markers are used as orientation aids for an image processing system which is used to ascertain the deposit positions for the individual elements of the semiconductor apparatus on the connection carrier 14. In this context, the deposit accuracy for the individual elements is preferably between +/−5 μm and +/−50 μm. Particularly preferably, the deposit accuracy is at least +/−10 μm.

Figure 2A:
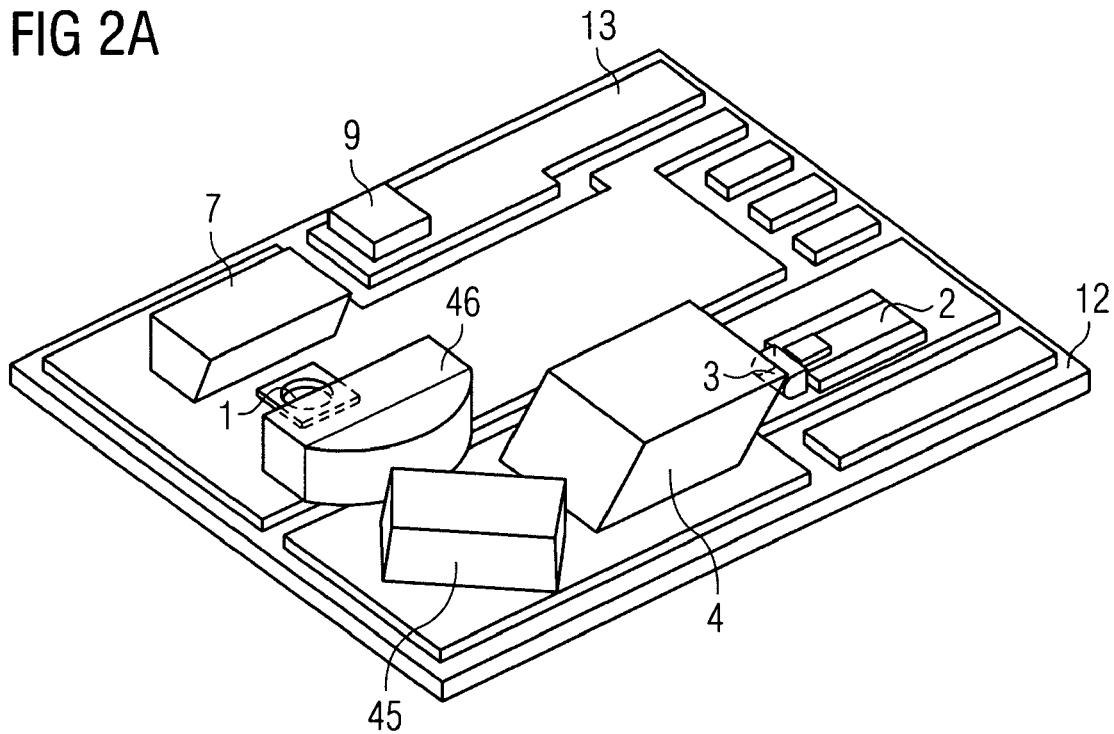
FIG. 2A shows a schematic perspective view of a pump unit in the semiconductor apparatus described here based on a third exemplary embodiment.

FIG. 2A shows a schematic perspective view of a pump unit in the semiconductor apparatus described here based on a third exemplary embodiment. In this exemplary embodiment, the base area of the semiconductor apparatus, that is to say the area of the connection carrier 14, is reduced by approximately 30% in comparison with the first two exemplary embodiments. In contrast to the exemplary embodiment described in connection with FIGS. 1A to 1F, the pump radiation source 2, the surface-emitting semiconductor body 1 and the deflection optics 7 are not arranged along a straight line in this case.

Pump radiation passes from the pump radiation source 2 through an FAC lens 3 first of all. From there, the pump radiation passes through an optical element 4 which is formed by a transmission prism or a parallelepiped, for example. From the deflection mirror 45, the pump radiation is then directed onto an aspherical cylinder lens 46 which collimates the pump radiation further. From there, the pump radiation hits the deflection optics 7, which direct the pump radiation onto the radiation passage area of the surface-emitting semiconductor body 1.

Figure 2B:
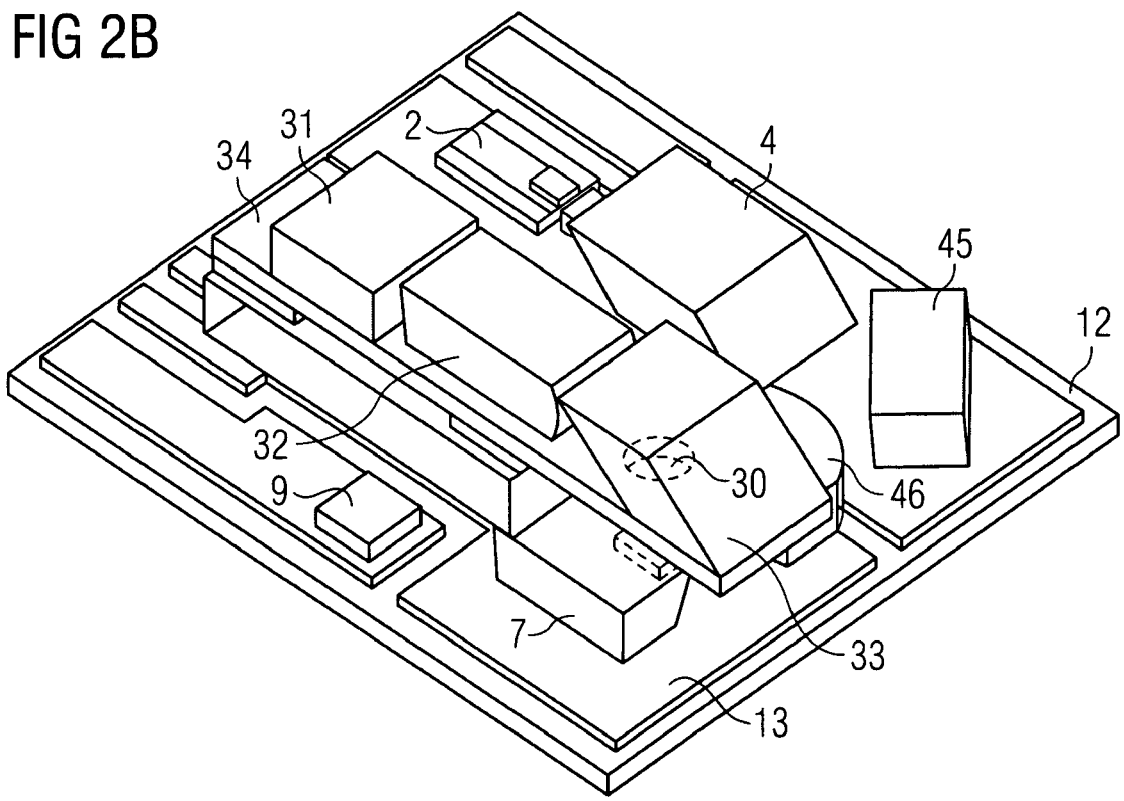
FIG. 2B shows a schematic perspective view of the surface-emitting semiconductor apparatus based on the third exemplary embodiment, viewed at a first angle.
Figure 2C:
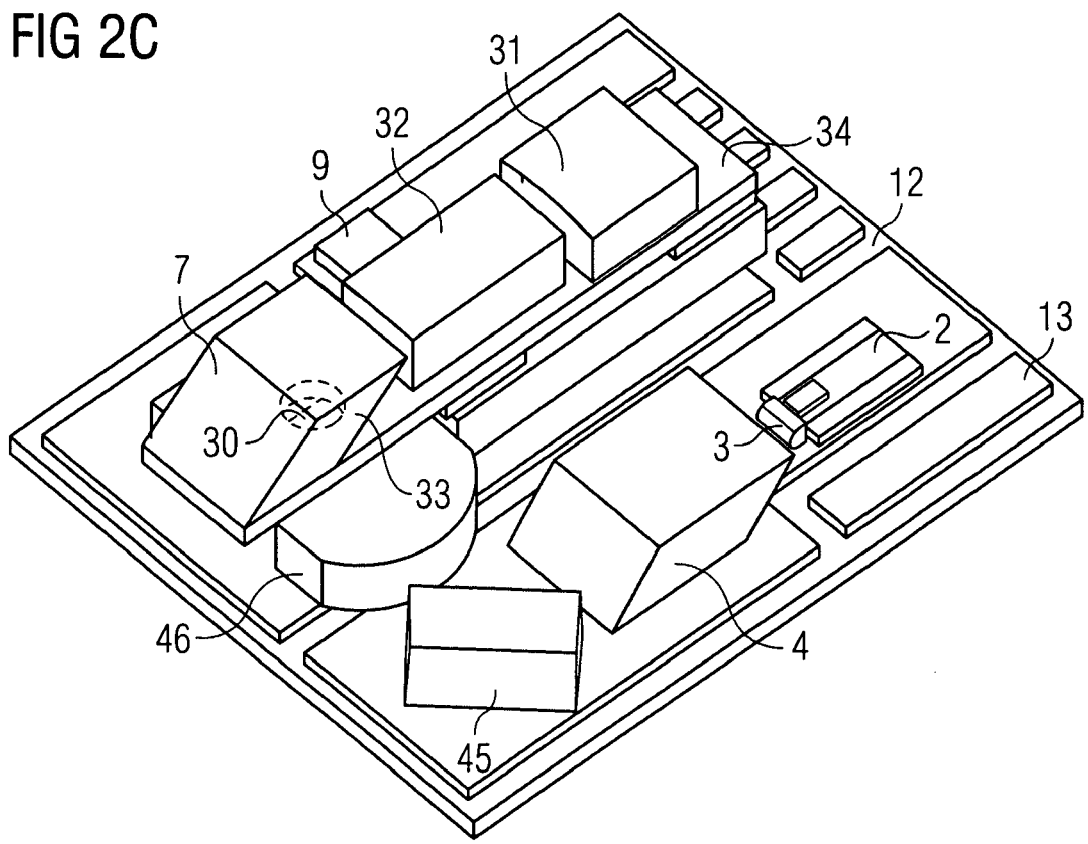
FIG. 2C shows the surface-emitting semiconductor apparatus based on the third exemplary embodiment, viewed at a second angle.

FIG. 2B shows a schematic perspective view of the surface-emitting semiconductor apparatus based on the third exemplary embodiment, viewed at a first angle. FIG. 2C shows the surface-emitting semiconductor apparatus based on the third exemplary embodiment at a second angle. In contrast to the exemplary embodiments described in connection with FIGS. 1A to 1F, the deflection optics 33 in the third exemplary embodiment are not formed by a dove prism but rather by a parallelepiped.

Figure 2D:
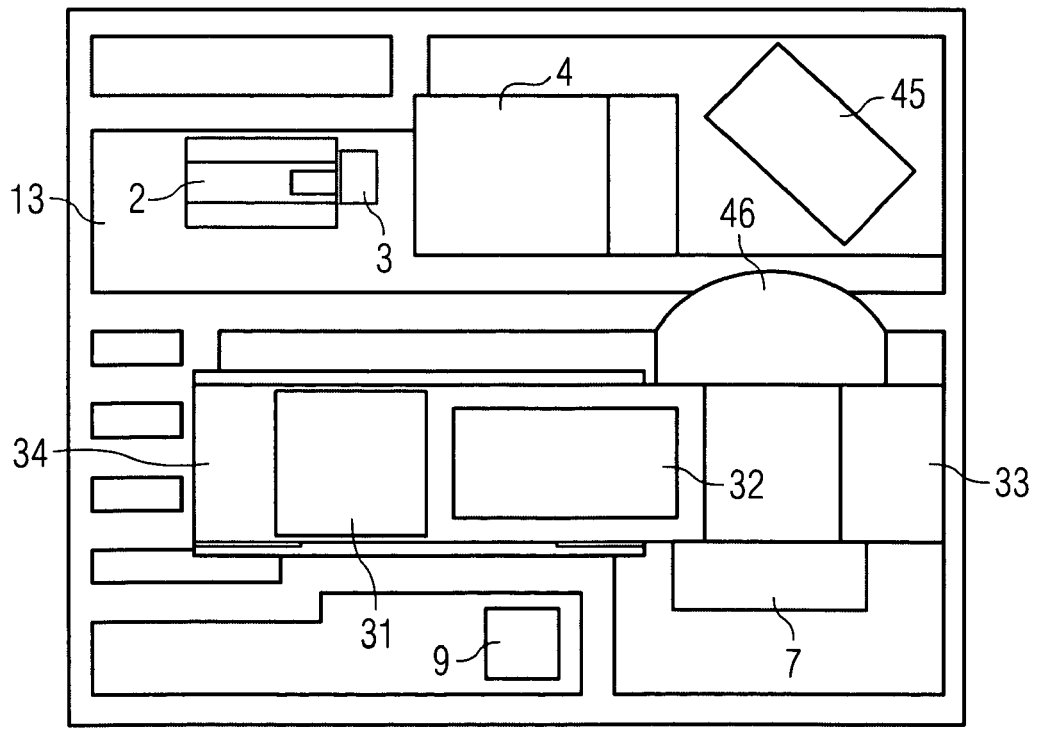
FIG. 2D shows a schematic plan view of the optically pumped semiconductor apparatus based on the third exemplary embodiment.

FIG. 2D shows a schematic plan view of the optically pumped semiconductor apparatus based on the third exemplary embodiment.

Figure 2E:
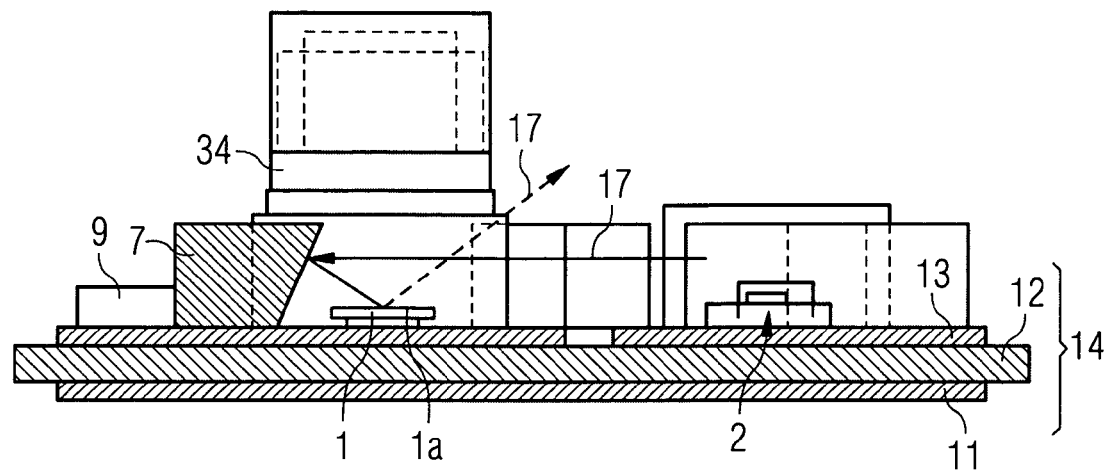
FIGS. 2E and 2F show schematic side views of the optically pumped semiconductor apparatus based on the third exemplary embodiment from different viewing directions.
Figure 2F:
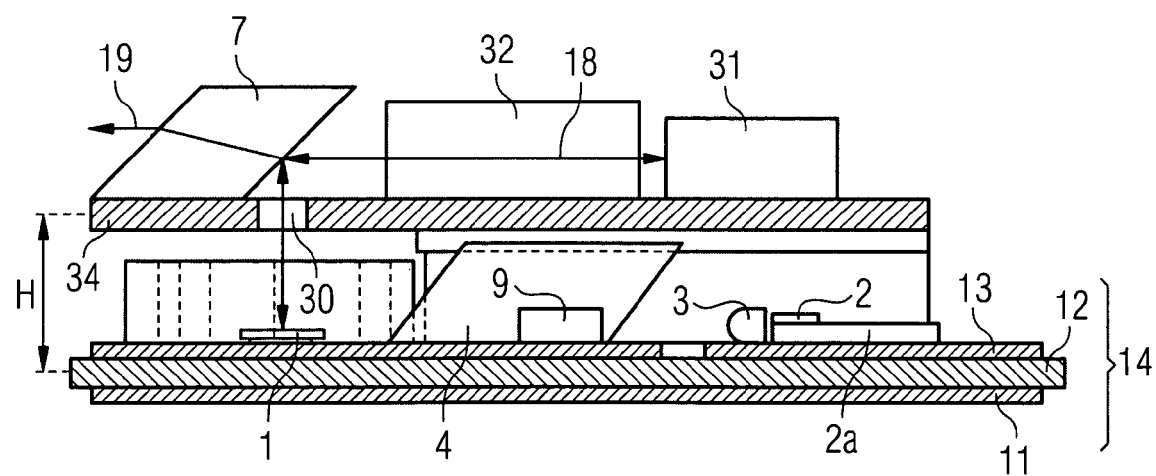

FIGS. 2E and 2F show schematic side views of the optically pumped semiconductor apparatus based on the third exemplary embodiment from different viewing directions.

As can be seen from FIG. 2E, in the case of the semiconductor apparatus based on the second exemplary embodiment, no pump radiation which is possibly reflected on the radiation passage area 1a of the surface-emitting semiconductor body 1 enters the optically nonlinear crystal. This advantageously allows particularly stable frequency conversion to take place, since the optically nonlinear crystal 32 cannot be heated by the reflected pump radiation 17.

Figure 2G:
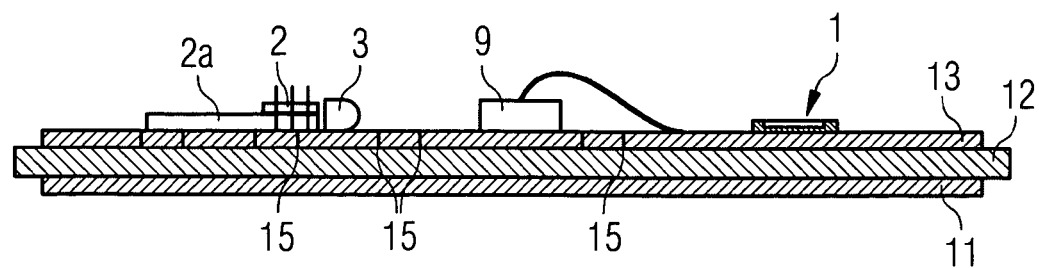
FIG. 2G shows a schematic side view of the pump unit in the optically pumped semiconductor apparatus based on the third exemplary embodiment before passive optical elements are fitted.
Figure 2H:
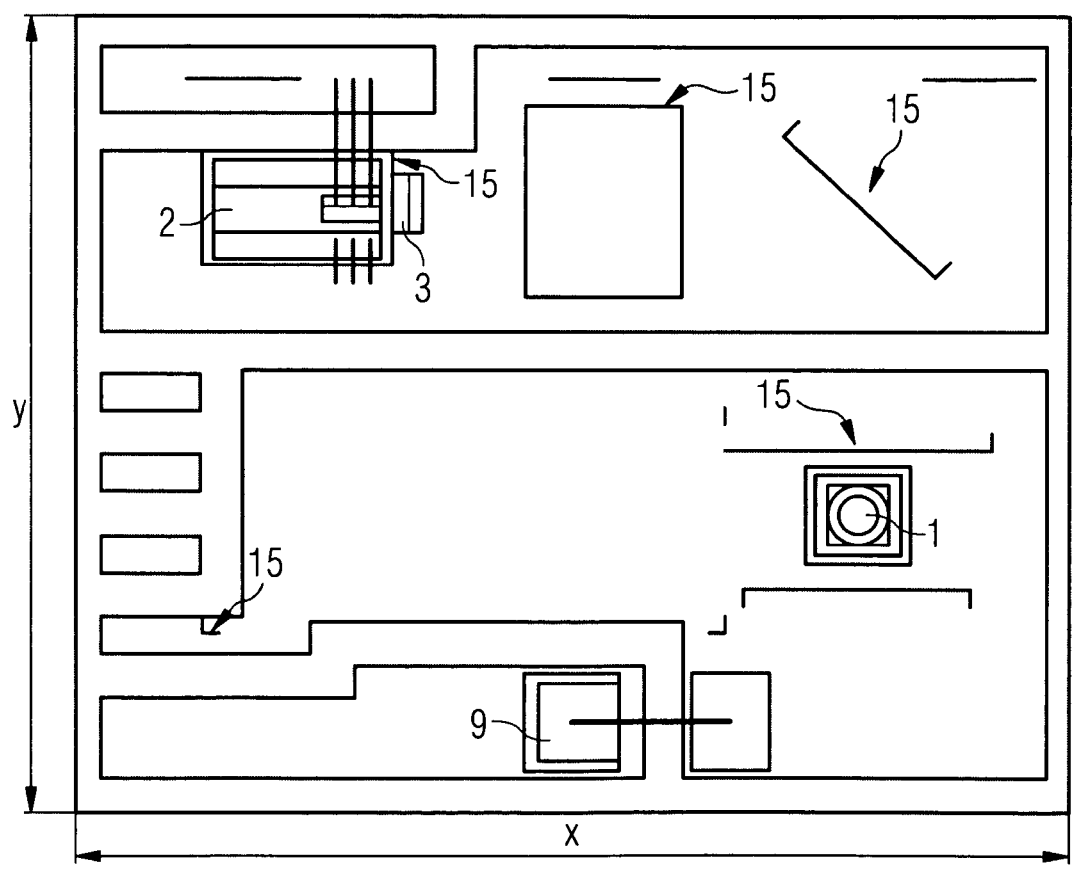
FIG. 2H shows the associated schematic plan view.

FIG. 2G shows a schematic side view of the pump unit in the optically pumped semiconductor apparatus based on the third exemplary embodiment before passive optical elements are fitted, and FIG. 2H shows the associated schematic plan view. As can be seen from FIGS. 2G and 2H, the connection carrier 14 has secondary alignment markers 15. That is to say that deposit structures 15 are patterned in the connection carrier 14 which are used as orientation aids for an image processing system. By way of example, the secondary alignment markers 15 are deposit structures which are in the form of photographically patterned thin layers.

The secondary alignment markers are used as orientation aids for an image processing system which is used to ascertain the deposit positions for the individual elements of the semiconductor apparatus on the connection carrier 14. In this case, the deposit accuracy for the individual elements is preferably between +/−5 μm and +/−50 μm. Particularly preferably, the deposit accuracy is at least +/−10 μm.

By way of example, the width y of the connection carrier 14 is between 9 and 13 mm, preferably approximately 10 mm. The length x of the connection carrier 4 is preferably between 9 and 14 mm, for example 12 mm.

FIGS. 3A, 3B, 3C and 3D show a schematic plan view of the fabrication of resonator top elements 40 for an exemplary embodiment of the semiconductor apparatus described here. FIG. 3E shows a schematic side view of a resonator top element 40 fabricated in this manner.

Figure 3A:
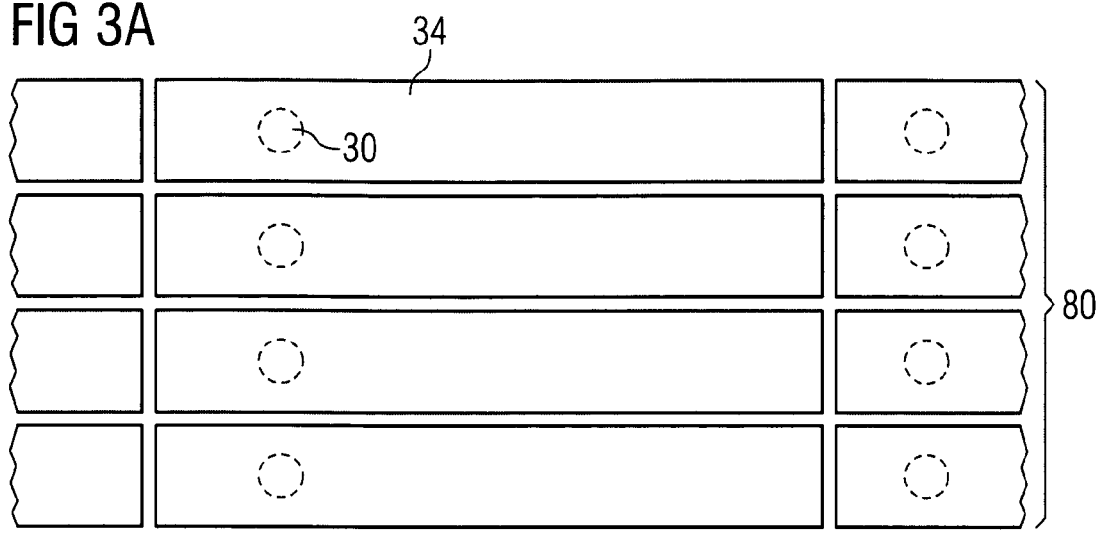
FIGS. 3A, 3B, 3C and 3D show a schematic plan view of the fabrication of resonator top elements 40 for an exemplary embodiment of the semiconductor apparatus described here.
Figure 3B:
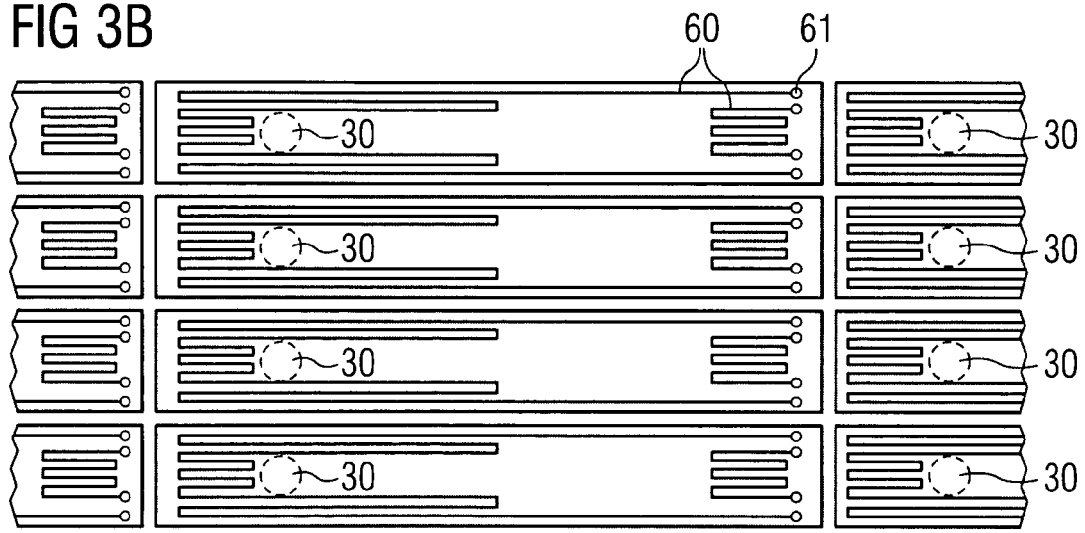

FIG. 3A shows a carrier assembly 80 which comprises a matrix-like arrangement of a multiplicity of individual carrier regions 34. The carrier assembly 80 is formed by a silicon wafer, for example. This is a six-inch or eight-inch silicon wafer, for example. Each individual carrier region 34 has a recess 30—for example a hole. The recess 30 allows laser radiation to pass into and out of the resonator top element 40.

In a subsequent method step (see FIG. 3B), a patterned metal coating 60 is patterned onto the individual carrier regions 34. By way of example, the metal coating 60 is formed by a meandrous platinum coating which can have electrical contact made with it by means of contact points 61.

Figure 3C:
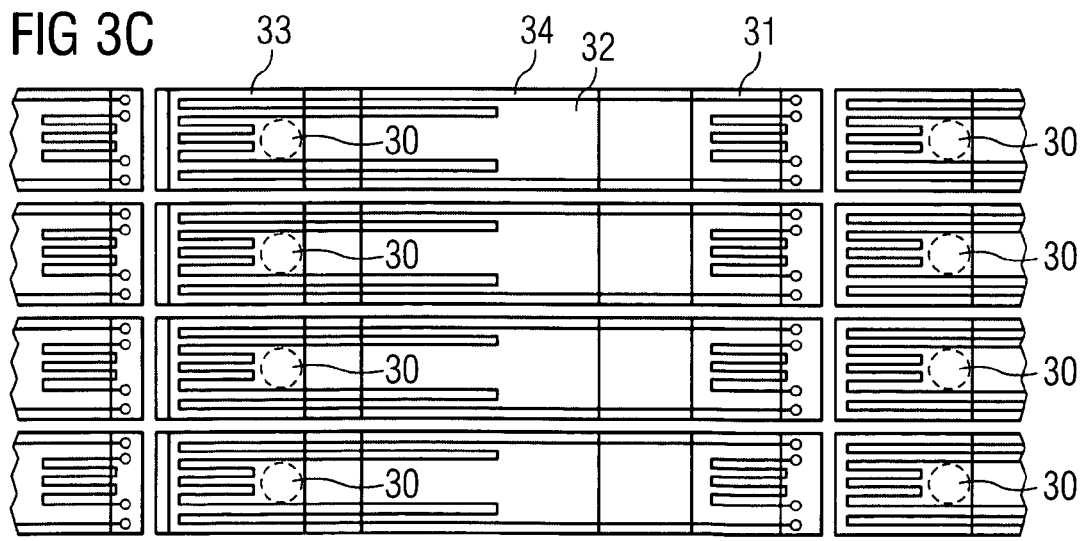

In the method step described in connection with FIG. 3C, optical elements such as a deflection mirror 33, an optically nonlinear crystal 34 and a resonator mirror 31 are arranged on the individual carrier regions 34. Preferably, the optical elements in the assembly—for example in the form of strips which comprise a multiplicity of resonator mirrors 31—are arranged on the carrier assembly 80. This means that a respective one of the optical elements can be arranged on a multiplicity of individual carrier regions 34 at the same time. By way of example, the optical elements can be adhesively bonded on. Preferably, the optical elements are mounted on the individual carrier regions 34 by means of bonding, for example anodic bonding.

Figure 3D:
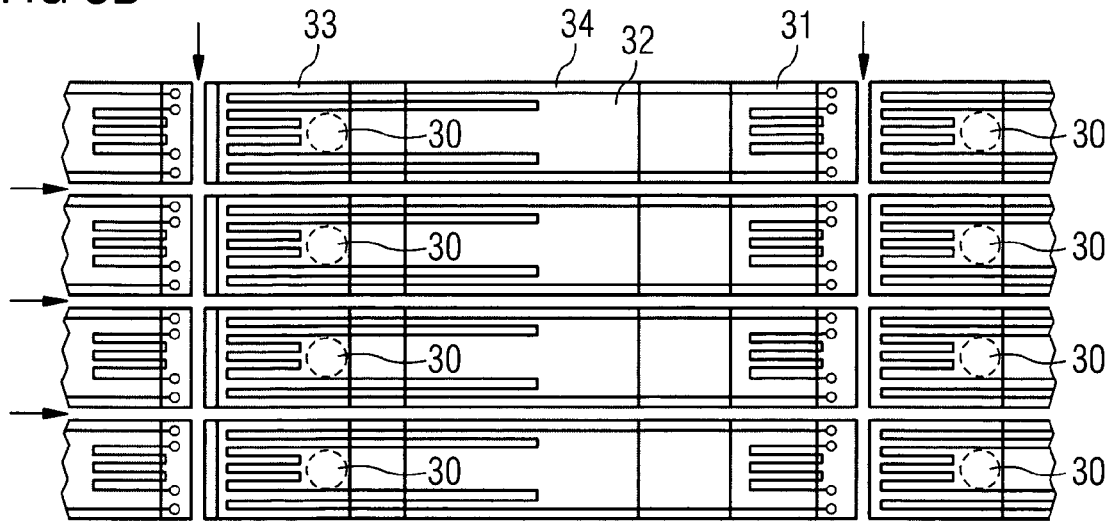
Figure 3E:
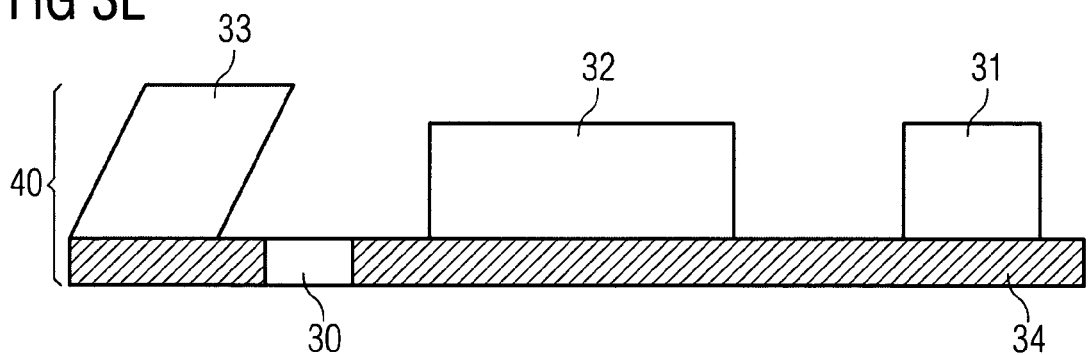
FIG. 3E shows a schematic side view of a resonator top element 40 fabricated in this manner.

In a concluding method step, the carrier assembly 80 can be separate as shown in FIG. 3D, along the arrows indicated therein. In this case, the optical elements arranged in the assembly can also be separated. The result is a multiplicity of resonator top elements 40.

One such resonator top element is shown schematically in FIG. 3E, for example.

Figure 3F:
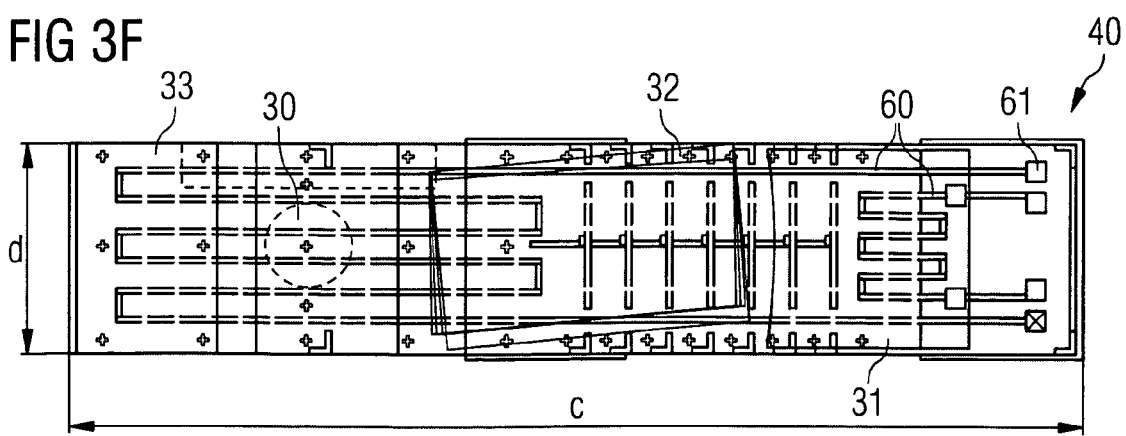
FIG. 3F shows a schematic plan view of a resonator top element 40 fabricated in this manner. Reference is made to FIGS. 4A to 4D when describing a fabrication method for fabricating the resonator mirror 31, as are used for an exemplary embodiment of the semiconductor apparatus described here.

FIG. 3F shows a schematic plan view of the resonator top element 40. Preferably, the length of the resonator top element 40 is between c=8 and c=12 mm, for example c=10 mm. The width of the resonator top element 40 is preferably between d=1.75 mm and d=3 mm, for example d=2.15 mm.

Figure 4A:
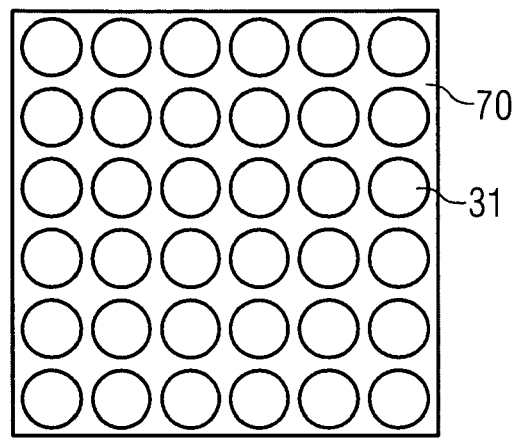

In connection with FIGS. 4A to 4D, one possible fabrication method for fabricating the resonator mirrors 31 is described, as used for an exemplary embodiment of the semiconductor apparatus described here. By way of example, this fabrication method involves silicon balls being shaped into a glass wafer 70, so that a multiplicity of resonator mirrors 31 can be produced in an array. FIG. 4A shows the associated schematic plan view of an array produced in this manner.

Figure 4B:
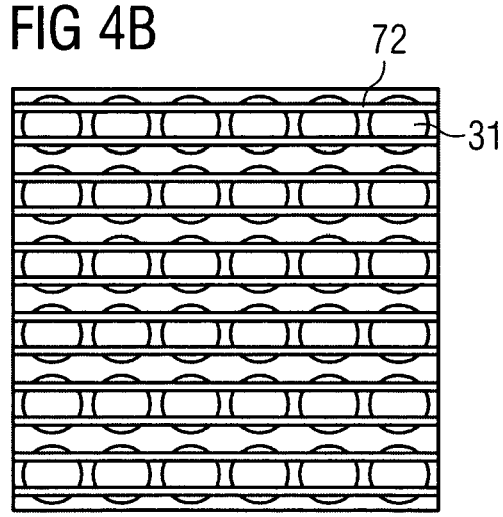
Figure 4C:
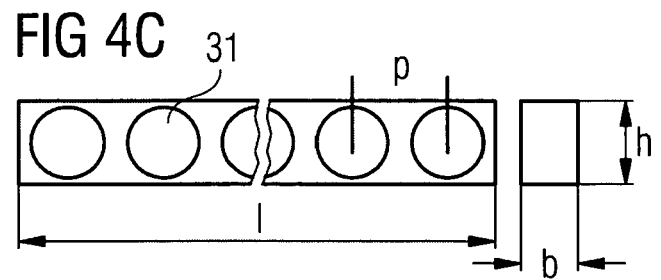
Figure 4D:
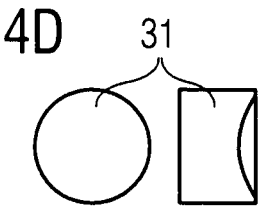

FIG. 4B shows the separation of the array 70 along lines 72. This produces the strips of micro mirrors 31 which are shown in FIG. 4C. Such a bar of micro mirrors has a length l of approximately 100 mm, for example. The distance p between the individual micro mirrors 31 is approximately 2 mm. The height h of the bar is preferably approximately 2 mm, and the width b is preferably between 0.7 and 2.5 mm.

Such a bar of micro mirrors can be disposed on a carrier assembly 80 as shown in FIGS. 3A to 3D, for example, and separated together with the carrier assembly 80. However, it is also possible for the strips to be separated into individual resonator mirrors 31 before they are disposed on individual carrier regions 34. Such resonator mirrors 31 are shown schematically in a plan view and a sectional view in FIG. 4D.

Figure 5:
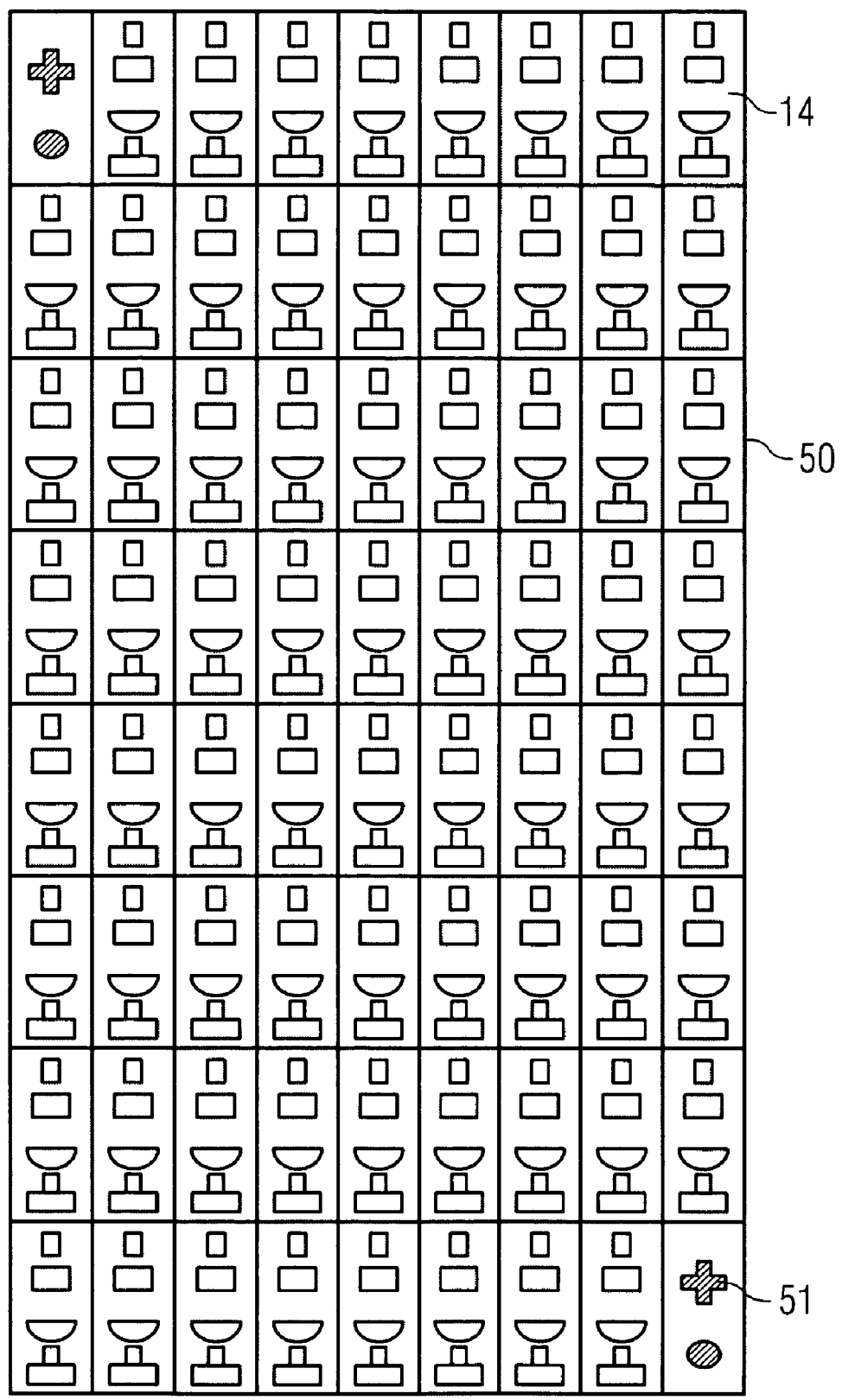
FIG. 5 shows a connection carrier assembly 50 having a multiplicity of connection carriers 14 arranged in the manner of a matrix, as are used for the exemplary embodiments of the semiconductor apparatus described here which are described in connection with FIGS. 1 and 2, for example.

FIG. 5 shows a connection carrier assembly 50 having a multiplicity of connection carriers 14 arranged in the manner of a matrix, as used for the exemplary embodiments of the semiconductor apparatus described here which are described in connection with FIGS. 1 and 2, for example. The connection carrier assembly 50 has primary alignment markers 51 which are arranged diagonally at two corners of the connection carrier assembly 50. By way of example, the primary alignment markers 51 may be thin-layer patternings in the material of the connection carrier assembly 50. It is also possible for the primary alignment markers 51 to be alignment chips, which may consist of silicon, glass or a ceramic, for example. These alignment chips may have thin-layer patternings. The primary alignment markers are used to align all the elements on the connection carrier assembly 50. The connection carrier assembly 50 forms a blank in this case. Since the individual elements in the blank are a unit, the following mounting processes are possible:
- elements are mounted as strips in one step and are later separated together with the blank,
- prism strips or lens strips are disposed,
- individual parts are mounted, which are placed in a suction tool in the manner of a matrix and so as to be self-aligning.

On account of the regular matrix-like arrangement of the connection carriers 14 in a connection carrier assembly 50, sequential or simultaneous arrangement of a multiplicity of elements is possible in one step.

The connection carrier assembly can be separated by sawing or scoring and breaking, for example. In this case, the connection carrier assembly 50 is preferably braced on an adhesive film in a frame.

The connection carrier assembly 50 preferably has a size of 50 mm×50 mm to 200 mm×200 mm. It may be round or rectangular. Preferably, the surface roughness of the connection carrier top is less than 1 μm. This allows particularly accurate alignment of the individual elements on the connection carrier.

Figure 6A:
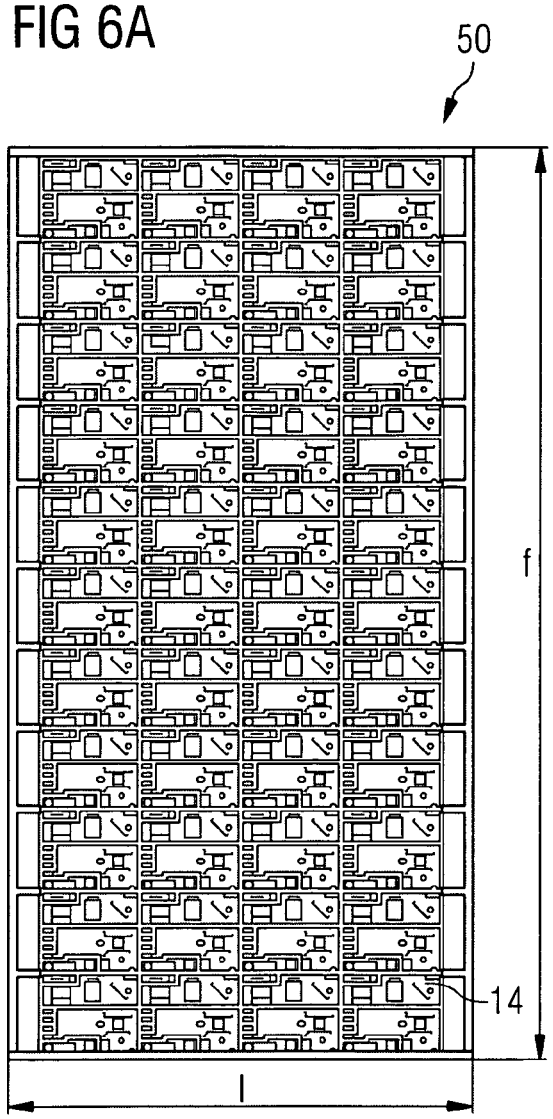
FIG. 6A shows a schematic plan view of a connection carrier assembly 50 having a multiplicity of connection carriers 14 arranged in the manner of a matrix, as are used for the exemplary embodiments of the semiconductor apparatus described here which are described in connection with FIGS. 1 and 2, for example.

FIG. 6A shows a schematic plan view of a connection carrier assembly 50 having a multiplicity of connection carriers 14 arranged in the manner of a matrix, as are used for the exemplary embodiments of the semiconductor apparatus described here which are described in connection with FIGS. 1 and 2, for example.

The length f of the connection carrier assembly 50 is between 100 and 120 mm, for example, preferably 110 mm. The width e of the connection carrier assembly 50 is preferably between 45 and 65 mm, for example 55 mm. In this exemplary embodiment, the connection carrier assembly 50 comprises 11 times 4 connection carriers 14.

Figure 6B:
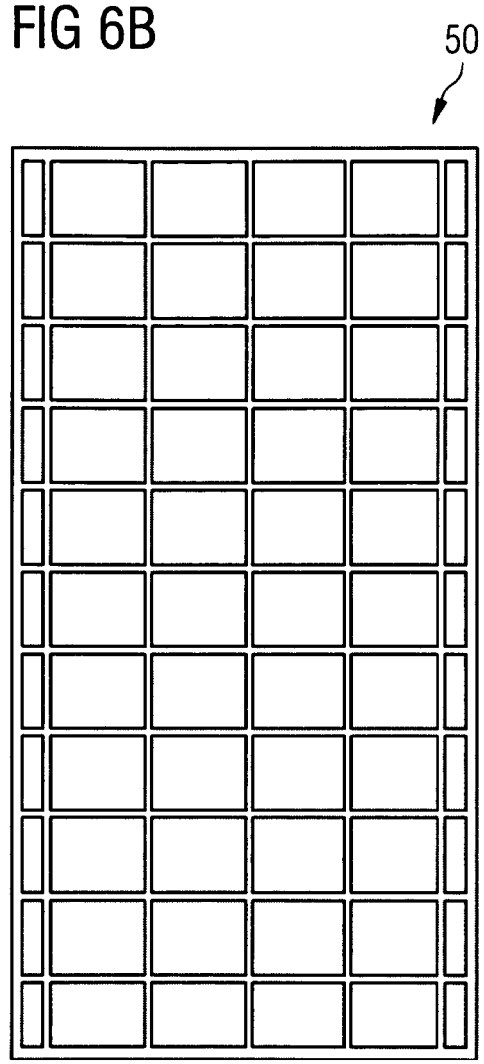
FIG. 6B shows a schematic plan view of the back of the connection carrier 50.

FIG. 6B shows a schematic plan view of the back of the connection carrier assembly 50.

Figure 6C:
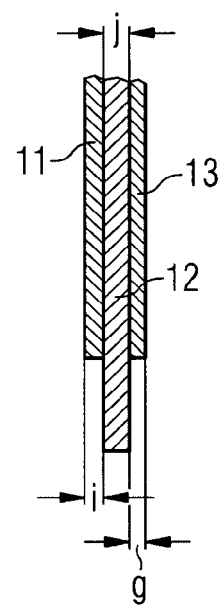
FIG. 6C shows a schematic side view of the connection carrier 50.

FIG. 6C shows a schematic side view of the connection carrier assembly 50. The width j of the basic body 12, which contains an aluminum nitride or which consists of an aluminum nitride, for example, is preferably between 0.25 and 0.45 mm, for example 0.38 mm. The thickness i of the bottom metallization 11, which consists of copper, for example, is preferably between 0.2 and 0.4 mm, for example 0.3 mm. The thickness g of the patterned top metallization 13, which consists of copper, for example, is preferably between 0.2 and 0.3 m, for example 0.25 mm.

Figure 6D:
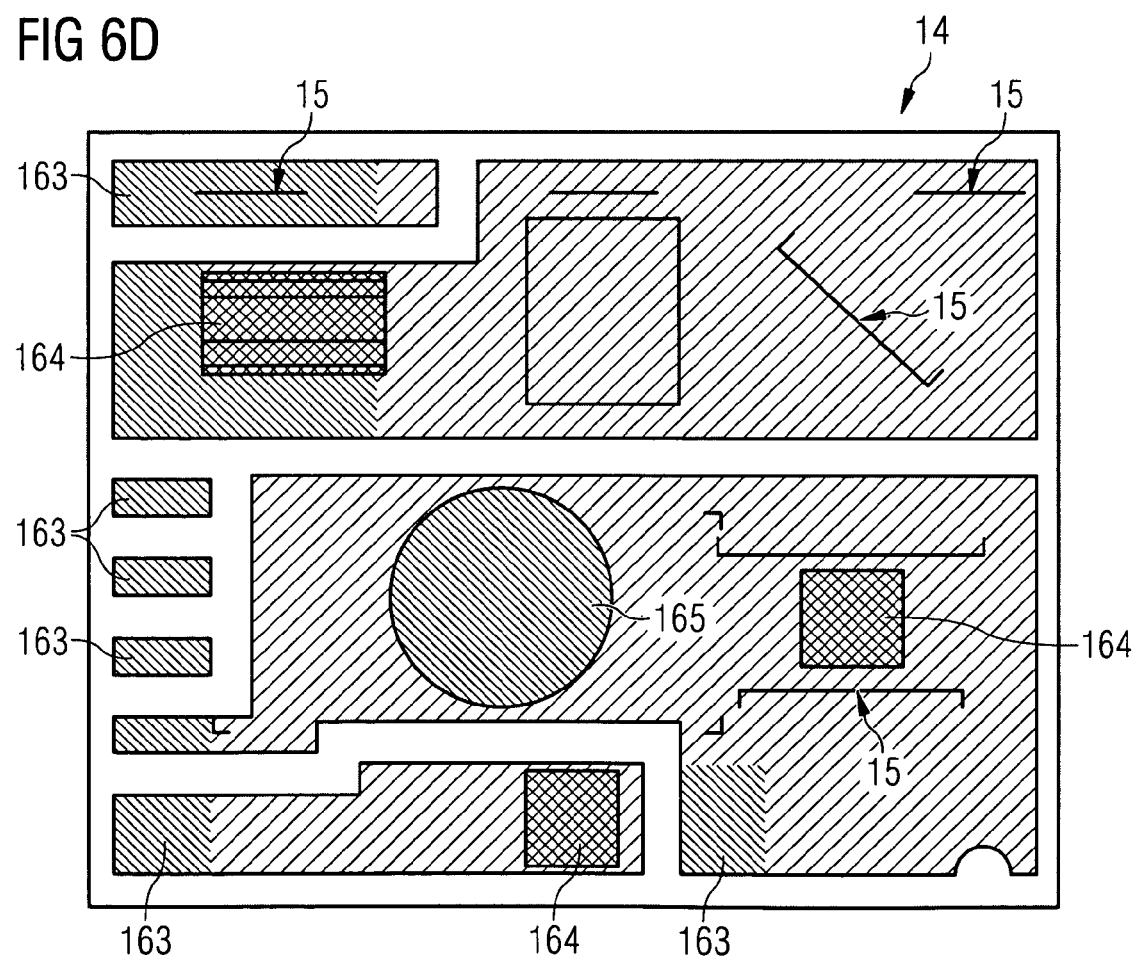
FIG. 6D shows a schematic plan view of a connection carrier 14 in the connection carrier assembly 50.

FIG. 6D shows a schematic plan view of a connection carrier 14 in the connection carrier assembly 50. The connection carrier 14 has wire bonding areas 163 which are provided for the purpose of making electrical contact with components on the connection carrier 14 by means of a bonding wire. In addition, the connection carrier 14 has solder areas 164 on which active components can be disposed. The connection carrier 14 also has a solder stop layer 165.

The semiconductor apparatus described here is distinguished, inter alia, by its particularly compact design. By way of example, this allows a resonator length of a few millimeters, preferably no more than 15 mm, particularly preferably no more than 10 mm. Such a short resonator length allows particularly rapid response times during laser production, as are advantageous for optical projection applications, for example. In addition, the semiconductor apparatus described here is distinguished, inter alia, by virtue of particularly the components which produce heat during operation, such as the pump radiation source and the surface-emitting semiconductor body, being disposed on a carrier with high thermal conductivity using planar mounting. This allows the heat produced during operation to be passed directly to the carrier and means that it does not need to be deflected by a particular angle, for example. In addition, the thermal decoupling of the pump unit and the resonator top element allows a particularly stable temperature for the optically nonlinear crystal. This means that it is possible to produce particularly uniform laser radiation in the visible range, for example.

The invention is not limited by the description with reference to the exemplary embodiments. Rather, the invention comprises any new feature and any combination of features, which includes particularly any combination of features in the patent claims, even if this feature or this combination itself is not explicitly indicated in the patent claims or exemplary embodiments.

The invention claimed is:

1. An optically pumped semiconductor apparatus comprising:
    a surface-emitting semiconductor body which has a radiation passage area which faces away from a mounting plane for the semiconductor body;
    an optical element which is suitable for directing pump radiation onto the radiation passage area of the semiconductor body; and
    a semiconductor laser component which comprises a source for the pump radiation;
    wherein the radiation passage area forms a part of the outer surface of the semiconductor body;
    wherein the semiconductor body, the optical element and the source for the pump radiation are arranged on a common first carrier;

wherein the semiconductor body is arranged in a mounting plane between the source for the pump radiation and the optical element; and wherein during operation of the semiconductor apparatus the pump radiation runs over the radiation passage area of the semiconductor body before hitting the radiation passage area.

2. The optically pumped semiconductor apparatus as claimed in claim 1, wherein the pump radiation source is arranged in a plane parallel to the mounting plane of the semiconductor body.

3. The optically pumped semiconductor apparatus as claimed in claim 1, wherein the first carrier is formed by a connection carrier to which the source for the pump radiation is electrically connected.

4. The optically pumped semiconductor apparatus as claimed in claim 1, wherein the optical element is configured to direct the pump radiation onto the radiation passage area of the semiconductor body through optical refraction.

5. The optically pumped semiconductor apparatus as claimed in claim 1, wherein the optical element is configured to direct the pump radiation onto the radiation passage area through a reflection.

6. The optically pumped semiconductor apparatus as claimed in claim 1, wherein the optical element is configured to direct the pump radiation in the direction of the mounting plane of the semiconductor body.

7. The optically pumped semiconductor apparatus as claimed in claim 1, further comprising:

a resonator top element arranged downstream of the mounting plane of the semiconductor body in a main radiation direction of the semiconductor body.

8. The optically pumped semiconductor apparatus as claimed in claim 7, wherein the resonator top element comprises a second carrier on which a resonator mirror is fitted.

9. The optically pumped semiconductor apparatus as claimed in claim 7, wherein the resonator top element is spaced apart from the mounting plane of the semiconductor body by a spacing element.

10. The optically pumped semiconductor apparatus as claimed in claim 9, wherein the spacing element comprises the optical element or is formed from the optical element.

11. The optically pumped semiconductor apparatus as claimed in claim 7, wherein the resonator top element comprises a frequency-converting element.

12. The optically pumped semiconductor apparatus as claimed in claim 11, wherein the resonator top element further comprises a heating element which is thermally conductively connected to the frequency-converting element.

13. The optically pumped semiconductor apparatus as claimed in claim 8, wherein the second carrier comprises a metal coating configured to increase and ascertain the temperature of the resonator top element.

14. The optically pumped semiconductor apparatus as claimed in claim 7, wherein the resonator top element is electrically conductively connected to the common first carrier.

15. The optically pumped semiconductor apparatus as claimed in claim 7, wherein during operation of the semiconductor apparatus the average temperature of the resonator top element is at least 10K above the average temperature of the first carrier.

16. An optical projection apparatus having an optically pumped semiconductor apparatus as claimed in claim 1 and a control apparatus which is provided for controlling the optically pumped semiconductor apparatus.

17. The optically pumped semiconductor apparatus as claimed in claim 5, wherein the optical element directs the pump radiation onto the radiation passage area through a single reflection.

18. The optically pumped semiconductor apparatus as claimed in claim 1, wherein the source for the pump radiation and the surface-emitting semiconductor body comprise discrete elements which are arranged at a distance to each other on the mounting plane for the semiconductor body.

19. The optically pumped semiconductor apparatus as claimed in claim 13, wherein the metal coating is formed by a meandrous platinum coating which is electrically contactable by contact points.

* * * * *